(12) United States Patent
Custodis

(10) Patent No.: US 7,888,861 B2
(45) Date of Patent: Feb. 15, 2011

(54) LUMINOUS MEANS AND LIGHTING DEVICE WITH SUCH A LUMINOUS MEANS

(75) Inventor: Udo Custodis, Wanchai (HK)

(73) Assignee: OSRAM Gesellschaft mit beschränkter Haftung, München (DE)

( * ) Notice: Subject to any disclaimer, the term of this patent is extended or adjusted under 35 U.S.C. 154(b) by 615 days.

(21) Appl. No.: 11/906,425

(22) Filed: Oct. 1, 2007

(65) Prior Publication Data
US 2008/0100210 A1 May 1, 2008

(30) Foreign Application Priority Data
Sep. 29, 2006 (DE) .................... 10 2006 046 197

(51) Int. Cl.
*H01L 51/52* (2006.01)
(52) U.S. Cl. .................... 313/504; 315/169.3; 439/65
(58) Field of Classification Search ......... 313/498–512; 428/690–691, 917; 438/26–29, 34, 82; 257/40, 257/72, 98–100, 642–643, 759, 82, 88; 427/58, 427/64, 66, 532–535, 539; 445/24–25; 315/169.1, 315/169.3; 362/145
See application file for complete search history.

(56) References Cited

U.S. PATENT DOCUMENTS

| 6,626,554 | B2 | 9/2003 | Rincover et al. | |
|---|---|---|---|---|
| 6,805,448 | B2 * | 10/2004 | Yokoyama et al. | 353/85 |
| 2004/0021425 | A1 | 2/2004 | Foust et al. | |
| 2004/0061107 | A1 * | 4/2004 | Duggal | 257/40 |
| 2005/0156173 | A1 * | 7/2005 | Yamazaki et al. | 257/72 |
| 2005/0270260 | A1 | 12/2005 | Pelzer et al. | |
| 2006/0065903 | A1 | 3/2006 | Sakurai et al. | |
| 2006/0238118 | A1 * | 10/2006 | Spindler | 313/506 |
| 2007/0257606 | A1 * | 11/2007 | Winters et al. | 313/505 |

FOREIGN PATENT DOCUMENTS

| DE | 103 24 787 | 2/2004 |
|---|---|---|
| DE | 102 42 978 | 3/2004 |
| EP | 1 643 557 | 9/2005 |

* cited by examiner

*Primary Examiner*—Nimeshkumar D Patel
*Assistant Examiner*—Donald L Raleigh
(74) *Attorney, Agent, or Firm*—Cohen Pontani Lieberman & Pavane LLP

(57) ABSTRACT

A luminous means having a first, light-transmissive carrier (1), a second carrier (3), and an organic layer stack (4), which is arranged between the first carrier (1) and the second carrier (3), at least one electrical connection region (5) being provided on the rear side (4), which faces away from the first carrier (1), of the second carrier (3), which connection region is provided for connecting the luminous means (20) to a further, identical luminous means. In addition, the invention specifies a lighting device with such a luminous means.

18 Claims, 4 Drawing Sheets

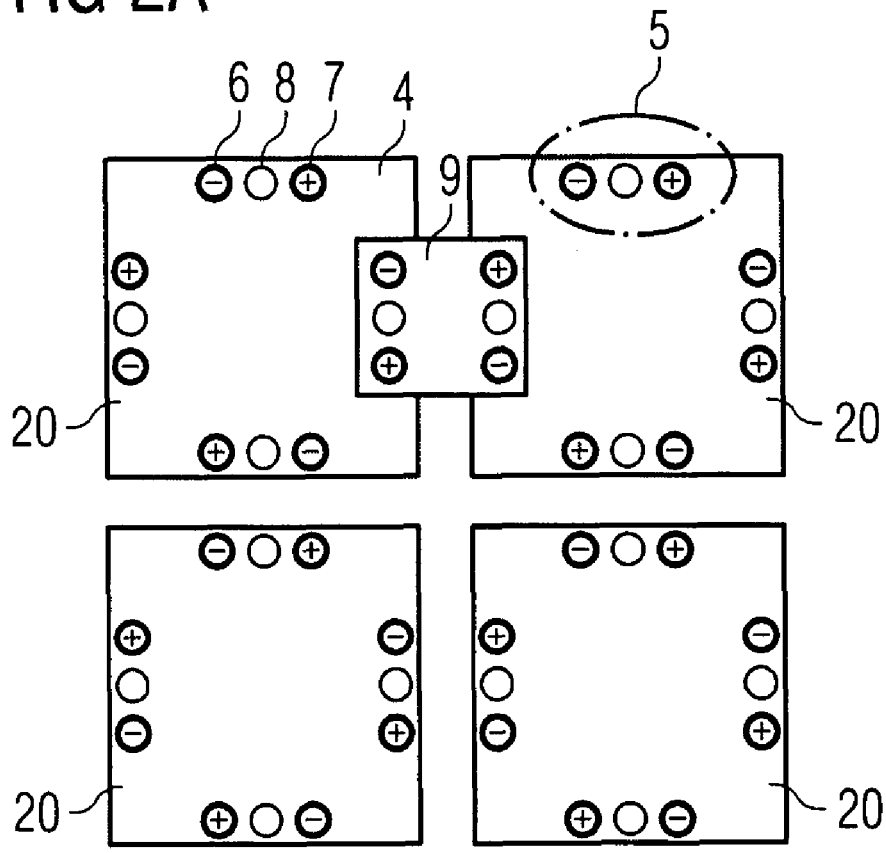
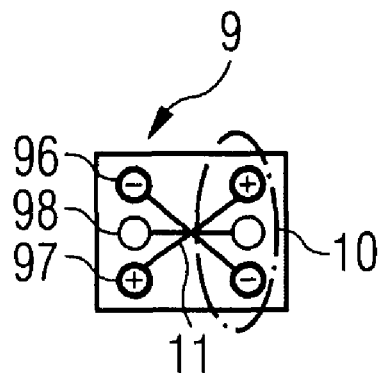

LUMINOUS MEANS AND LIGHTING DEVICE WITH SUCH A LUMINOUS MEANS

RELATED APPLICATION

This patent application claims the priority of the German patent application 10 2006 046 197.5 filed Sep. 29, 2006, the disclosure content of which is hereby incorporated by reference.

FIELD OF THE INVENTION

The invention is related to a luminous means. Moreover, the invention involves a lighting device with such a luminous means

BACKGROUND OF THE INVENTION

Document U.S. Pat. No. 6,626,554 describes a luminous means.

SUMMARY OF THE INVENTION

An object of the invention is to provide a luminous means which can be produced in a particularly cost-effective manner.

A further object of the present invention is to provide a lighting device with such a luminous means.

In accordance with at least one embodiment of the luminous means, the luminous means comprises a first carrier. The first carrier can be designed to be light-transmissive. This means that the first carrier is transmissive to at least part of the light produced in the luminous means. The first carrier can in this case be, for example, optically diffusely scattering—for example like a pane of opal glass—or else transparent.

In accordance with at least one embodiment of the luminous means, the luminous means comprises a second carrier. The second carrier may be designed to be light-transmissive or light-nontransmissive. The second carrier can be designed to be reflective at least for part of the light produced in the luminous means. For this purpose, the second carrier can be designed to be reflective in such a way that at least part of the light produced in the luminous means is reflected by the second carrier in the direction of the first carrier.

In accordance with at least one embodiment of the luminous means, the luminous means comprises an organic layer stack. The organic layer stack comprises at least one organic layer. The organic layer may be suitable, for example, for producing electromagnetic radiation. For example, the organic layer stack is part of an organic light-emitting diode (OLED). Then, electrode layers—a cathode layer and an anode layer—which are provided for making electrical contact with the layer stack, adjoin the organic layer stack.

In accordance with at least one embodiment of the luminous means, the organic layer stack is arranged between the first carrier and the second carrier. In this case, one of the carriers can be used as a substrate to which the organic layer stack is applied. The carrier then forms the substrate of the organic light-emitting diode. The organic layer stack is part of the organic light-emitting diode. It is furthermore possible for an organic light-emitting diode comprising the organic layer stack to be adhesively bonded onto the carrier.

The two carriers—that is to say the first and the second carrier—act as protection for the organic layer stack both from mechanical loading and from the uptake of moisture or hazardous atmospheric gases.

In accordance with at least one embodiment of the luminous means, an electrical connection region is provided on the rear side, which faces away from the first carrier, of the second carrier, which also faces away from the organic layer stack. The electrical connection region is provided for electrically connecting the luminous means to a further, identical luminous means. An identical luminous means is in this case understood to mean a luminous means which at least also has a first carrier, which is light-transmissive, a second carrier and an organic layer stack, which is arranged between the first carrier and the second carrier. Furthermore, the further, identical luminous means also has at least one connection region, which is provided for connecting the luminous means to an identical luminous means.

In accordance with at least one embodiment of the luminous means, the luminous means has a first, light-transmissive carrier. Furthermore, the luminous means has a second carrier. The luminous means also comprises an organic layer stack, which is arranged between the first carrier and the second carrier, at least one electrical connection region being arranged on the rear side, which faces away from the first carrier, of the second carrier, which connection region is provided for connecting the luminous means to a further, identical luminous means.

In accordance with at least one embodiment of the luminous means, the at least one connection region comprises at least one connection point, which is provided for electrical contact-making. The luminous means can be electrically conductively connected to the further, identical luminous means via the electrical connection point.

In accordance with at least one embodiment of the luminous means, the at least one connection region of the luminous means comprises at least one connection point, which is provided for passing on a control signal. The control signal is suitable for controlling the luminous means, which has the connection region, or the further, identical luminous means to which the luminous means is connected. Control can consist, for example, in switching-on or switching-off, in dimming or in changing the color of the light emitted by the driven luminous means.

For example, a control signal can be passed on, via the connection point, from the luminous means to the further, identical luminous means, to which the luminous means is connected via the connection region. It is furthermore possible for a control signal to be injected into the luminous means via the connection point.

In accordance with at least one embodiment of the luminous means, the luminous means comprises a large number of identical connection regions, which are provided for connecting the luminous means to in each case one further, identical luminous means. Each connection region comprises at least one electrical connection point, which is provided for electrical contact-making, and at least one connection point, which is provided for passing on a control signal.

In accordance with at least one embodiment of the luminous means, at least one of the carriers of the luminous means contains a glass or consists of a glass. It is furthermore possible for the two carriers—that is to say the first and the second carrier—to contain a glass or to consist of a glass.

In accordance with at least one embodiment of the luminous means, the luminous means comprises a luminous face having an area of at most 1000 mm$^2$. Preferably, the area of the luminous face is at most 500 mm$^2$, particularly preferably at most 400 mm$^2$. In this case, the luminous face is understood as being that face of the luminous means through which the luminous means allows at least a large proportion of the light emitted by the luminous means. For example, the luminous face is formed by the front side, which is remote from the organic layer stack, of the first carrier.

The luminous means has external dimensions of at most 300 mm×300 mm, preferably at most 20 mm×20 mm and at least 10 mm×10 mm. This means that the luminous means is square, for example, and the specified numerical values are then the edge lengths of the luminous means.

In accordance with at least one embodiment of the luminous means, the luminous means has a luminance of at most 250 cd/m$^2$. Preferably, the luminance is at most 200 cd/m$^2$, particularly preferably at most 150 cd/m$^2$.

A luminous means described here makes use, inter alia, of the idea that, by means of connecting a large number of luminous means by means of the connection regions of the luminous means, it is possible to form a lighting device which has a relatively large luminous face owing to the large number of luminous means. The individual luminous means can therefore have a relatively small luminous face. In addition, it is also sufficient for the individual luminous means for them to have a relatively low luminance.

The use of luminous means with a relatively small luminous face makes it possible to make optimum use of the production of the luminous means, since defects can be eliminated. This means that, in the event of the occurrence of a defect in the luminous means, the relatively small luminous means can be rejected without any significant financial cost being incurred. In addition, luminous means with a relatively low luminance of, for example, at most 250 cd/m$^2$ can be produced, more easily and more cost-effectively than luminous means with a higher luminance. Furthermore, when using a large number of small luminous means, i.e. luminous means with a small luminous face, fluctuations in the luminance in the individual luminous means can be tolerated more easily than when a few large luminous means are used. This also allows cost-effective production of the luminous means.

In accordance with at least one embodiment of the luminous means, the luminous means has a control apparatus, which is arranged on the rear side of the second carrier. The control apparatus is connected to each connection region of the luminous means. In particular, the control apparatus is connected to the connection points of the connection regions of the luminous means which are provided for passing on control signals. The control apparatus may be, for example, a microcontroller.

Another aspect of the invention is directed to a lighting device. In accordance with at least one embodiment of the lighting device, the lighting device comprises at least one first and at least one second luminous means, as are described in conjunction with one of the previous embodiments. Furthermore, the lighting device comprises at least one connecting element, which connects the connection regions of the first and the second luminous means to one another. In this case, the connecting element connects the connection points of the connection region of the first luminous means, which are provided for electrical contact-making, to corresponding connection points of the connection region of the second luminous means. Furthermore, the connecting element connects those connection points of the connection region of the first luminous means which are provided for passing on a control signal to corresponding connection points of the second luminous means.

In accordance with at least one embodiment of the lighting device, the connecting element, in addition to the production of an electrical connection between two luminous means, is also suitable for mechanically connecting two luminous means. For example, the connecting element connects the first and the second luminous means mechanically to one another by means of a plug-type connection.

The connection between the two luminous means by the connecting element is designed to be releasable. In this way it is possible for a defective luminous means to be released from the lighting device and for a new, functional luminous means to be inserted in its place.

In accordance with at least one embodiment of the lighting device, the lighting device comprises a large number of luminous means. In this case, each luminous means is connected to at least one further luminous means of the lighting device by means of a connecting element, which connects the connection regions of the luminous means to one another. In this way it is possible for the lighting device to be in the form of a matrix. This means that the luminous means can be arranged next to one another in a plurality of rows and columns. Those luminous means which are not arranged at the outermost edge of the lighting device are then connected, for example, to in each case four further, identical luminous means via in each case one connecting element.

In accordance with at least one embodiment of the lighting device, the luminous means of the lighting device can be driven independently of one another. The lighting device can then be used, for example, as a coarse-grained display, each luminous means of the lighting device forming a pixel of this coarse-grained display. In this way, the luminous means can be used, for example, as a display apparatus.

It is furthermore possible for a lighting device described here to be used as a backlighting apparatus for a display, for example an LCD display.

Furthermore, a lighting device described here can also be used as a construction material, for example as wall or ceiling tiles in a bathroom.

BRIEF DESCRIPTION OF THE DRAWINGS

FIG. 2A shows a schematic plan view of a first exemplary embodiment of a lighting device described here.

FIG. 2B shows a schematic plan view of an exemplary embodiment of a connecting element, as is used in the first exemplary embodiment of the lighting device.

DETAILED DESCRIPTION OF THE DRAWINGS

Identical or functionally identical components in the exemplary embodiments and figures have each been provided with the same reference symbols. The elements illustrated are not to be regarded as being true to scale, but instead individual elements can be illustrated as being excessively large for reasons of better understanding.

Figure 1A:
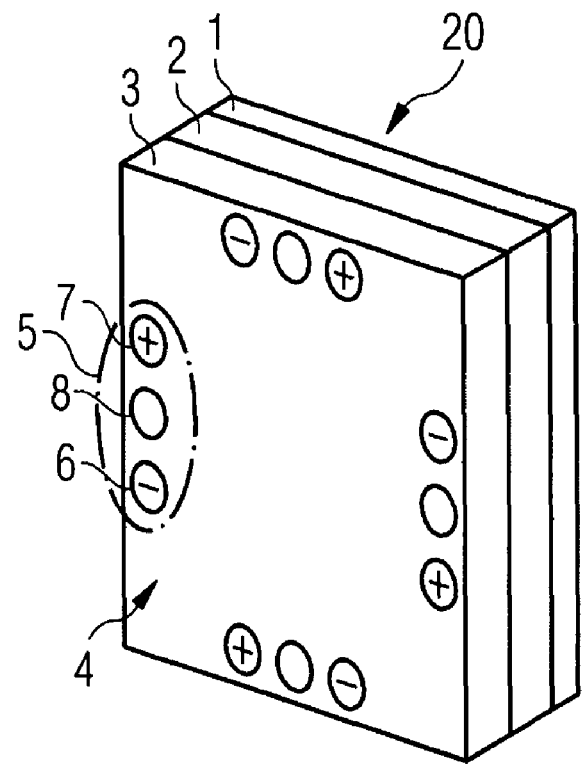
FIG. 1A shows a schematic, perspective illustration of a first exemplary embodiment of a luminous means described here.
Figure 1B:
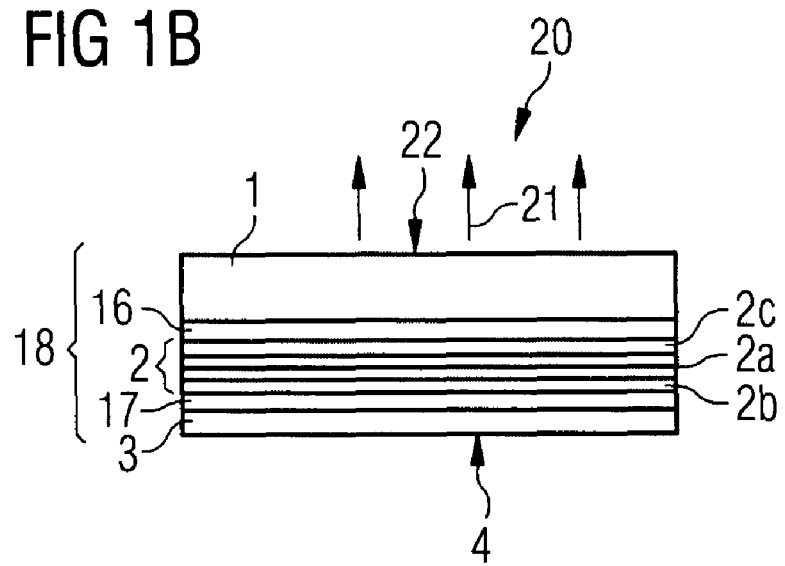
FIG. 1B shows a schematic, sectional illustration of the first exemplary embodiment of a luminous means described here.

FIG. 1A shows a schematic, perspective illustration of a first exemplary embodiment of a luminous means 20 described here. FIG. 1B shows a schematic, sectional illustration of the first exemplary embodiment of a luminous means 20 described here.

The luminous means 20 in accordance with the first exemplary embodiment comprises a first carrier 1, which, in the exemplary embodiment, is formed from a glass. The first carrier 1 is transmissive to light 21 produced by the luminous means 20. The light 21 leaves the luminous means through the luminous face 22 of the luminous means 20 which is formed by the front side, which faces away from the layer stack 2, of the first carrier 1.

In addition, the luminous means in accordance with the first exemplary embodiment comprises an organic layer stack 2, which comprises at least one organic layer 2a. The organic layer 2a is suitable for producing electromagnetic radiation. The organic layer 2a contains, for this purpose, at least one organic emitter material.

The organic layer stack 2 can furthermore comprise further layers 2b, 2c, which are suitable, for example, for injecting and conducting charge carriers into the organic layer 2a. Electrode layers 16, 17 adjoin the organic layer stack 2.

The organic layer stack 2 forms, together with the electrode layers 16, 17, an organic light-emitting diode 18. The organic light-emitting diode 18 is either applied to the first carrier 1 or the second carrier 3 directly—the carrier then forms a substrate for the organic light-emitting diode. In addition it is possible for the organic light-emitting diode to be adhesively bonded to the first carrier 1 and/or the second carrier 3.

In accordance with the exemplary embodiment in FIGS. 1A and 1B, the second carrier 3 is formed from a glass or contains a glass. For example, at least portions of the rear side 4 of the second carrier 3 are designed to be reflective for the light 21 produced by the luminous means 20. This can be realized, for example, by a metal coating of the rear side 4 of the second carrier 3.

As can be seen in particular from the perspective illustration in FIG. 1A, connection regions 5 are formed on the rear side 4 of the luminous means 20.

Each connection region 5 of the luminous means 20 comprises a first connection point 6, which is provided for electrically connecting the luminous means 20 to a further, identical luminous means 20. For example, an electrical current is conducted into the luminous means 20 or guided away from the luminous means 20 into the further luminous means 20 via the first connection point 6.

Each connection region 5 further comprises a second connection point 7, which is provided for electrically connecting the luminous means 20 to a further, identical luminous means 20. For example, an electrical current is impressed into the luminous means 20 or guided out of the luminous means 20 into another luminous means also via the second connection point 7.

Each connection region 5 further comprises a third connection point 8. The third connection point 8 is provided for passing on a control signal, which is produced, for example, by a control apparatus or a regulating apparatus (not shown), from the luminous means into the further, identical luminous means, which is connected to the luminous means 20.

The connection regions 5 of the luminous means 20 are arranged on the rear side 4 of the second carrier 3. In this case, the connection regions 5 are arranged near to the edge at the side faces of the rear side 4 of the second carrier 3.

The connection points 6, 7, 8 of each connection region 5 of the luminous means 20 are arranged along a straight line. In this case, the third connection point 8 is arranged between the first and the second connection point 6, 7. The connection points 6, 7, 8 of the connection regions 5 of the luminous means 20 are arranged, for example, in such a way that, when running through the connection points 6, 7, 8 along the periphery of rear side 4, the sequence is as follows: first a first connection point 6, then a third connection point 8, then a second connection point 7, then a first connection point 6, then a third connection point 8, then a second connection point 7, etc.

The luminous means described in conjunction with FIGS. 1A and 1B has a square basic area with an edge length of at least 10 mm and at most 20 mm. The luminance of the luminous means 20 is approximately 150 cd/m$^2$.

FIG. 2A shows, in a schematic plan view, a first exemplary embodiment of a lighting device described here. FIG. 2B shows, in a schematic plan view, an exemplary embodiment of a connecting element 9, as is used in the first exemplary embodiment of the lighting device.

The lighting device in accordance with the first exemplary embodiment comprises four luminous means 20, as are described, for example, in more detail in conjunction with FIGS. 1A and 1B. Using the example of two luminous means 20 of the lighting device in accordance with the first exemplary embodiment, the connection of the luminous means by means of the connecting element 9 is shown. The connecting element 9 has smaller external dimensions than the luminous means 20 of the lighting device. For example, the area of the base of the connecting element 9 is at most 30% of the area of the base of the luminous means 20.

As can be seen from the detailed illustration in FIG. 2B, the connecting element 9 has conductor tracks 11. The conductor tracks 11 connect connection points 96, 97, 98 of the two connection regions 10 of the connecting element 9 electrically to one another. Although conductor tracks 11 may appear to intersect in FIG. 2B (and in FIGS. 3A-4), such as in the center of connection element 9, of course they cross in a manner involving no electrical contact therebetween. Thus, connection point 96 on the left side of connecting element 9 is connected to connection point 96 on the right side of connecting element 9. The same applies to connection points 97 and 98. The connection points 6, 8, 7 of a connection region 5 of the first luminous means 20 are connected to the corresponding connection points 96, 97, 98 of the connecting element 9.

Furthermore, the connecting element 9 also represents a mechanical connection between the luminous means 20 of the lighting device. The connection points 6, 8, 7 of the connection region 5 of the luminous means 20 are in this case electrically conductively connected to the connection points 96, 97, 98 of the connecting element 9, for example by means of preferably releasable plug-type connections or soldered joints.

Figure 3A:
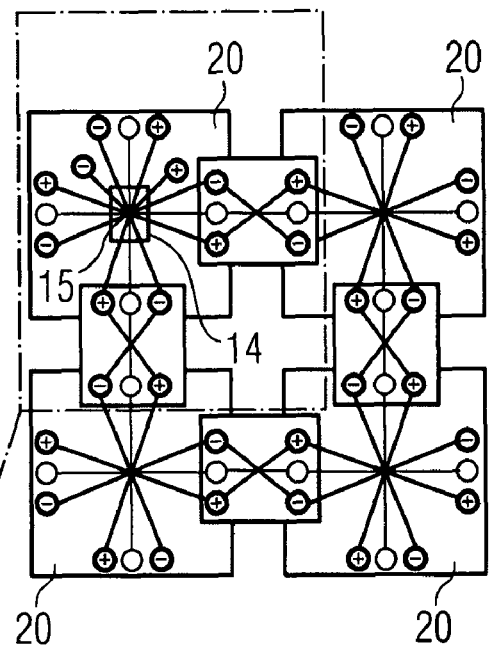
FIG. 3A shows a schematic plan view of a second exemplary embodiment of a lighting device described here.
Figure 3B:
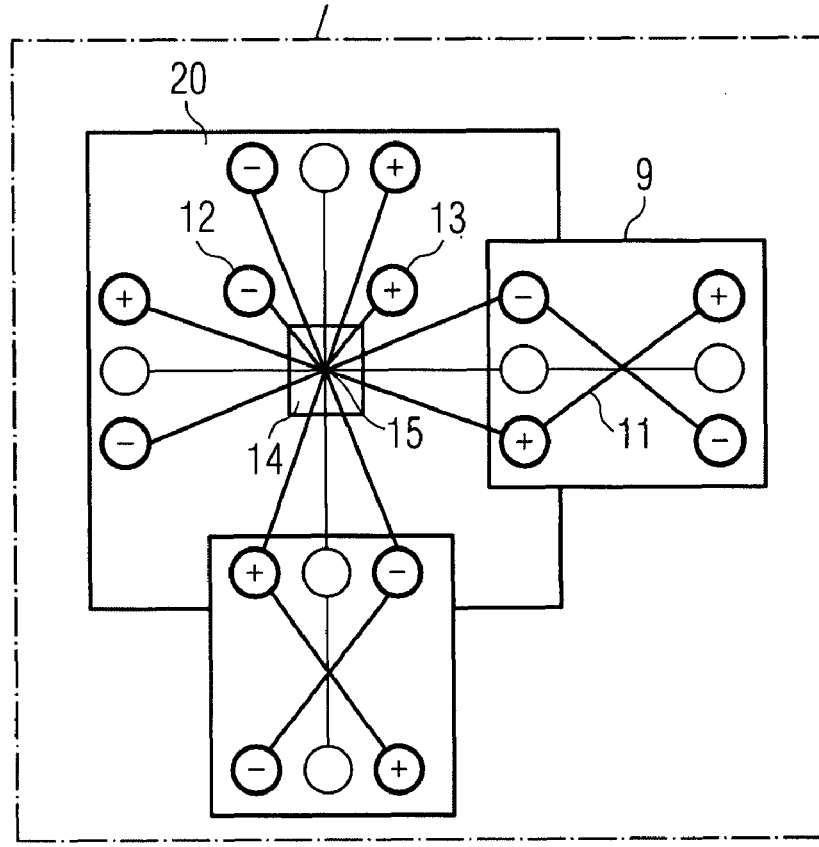
FIG. 3B shows a schematic plan view of a detail of the second exemplary embodiment of a lighting device described here.

FIG. 3A shows a schematic plan view of a second exemplary embodiment of a lighting device described here. FIG. 3B shows, in a schematic plan view, a detailed view of the second exemplary embodiment of a lighting device described here.

The lighting device shown in FIG. 3A comprises four luminous means. The four luminous means 20 are electrically conductively and mechanically connected to one another in pairs by connecting elements 9. One of the luminous means 20 has a control apparatus 14, in which a switching apparatus 15 is integrated. All of the connection regions 5 of the luminous means 20, which comprises the control apparatus 14, are electrically conductively connected to the control apparatus 14. The luminous means 20 with the control apparatus 14 also has contact points 12, 13 for connecting the lighting device to a current or voltage source.

The control signal is passed on from the control apparatus 14 via the connecting element 9 to the remaining luminous means 20 of the lighting device by means of the conductor tracks 11.

The control apparatus 14 comprises a switching apparatus 15, by means of which the lighting device can be switched on and off. The switch 15 is integrated, for example, in the control apparatus 14. The control apparatus 14 is preferably a microcontroller.

Figure 4:
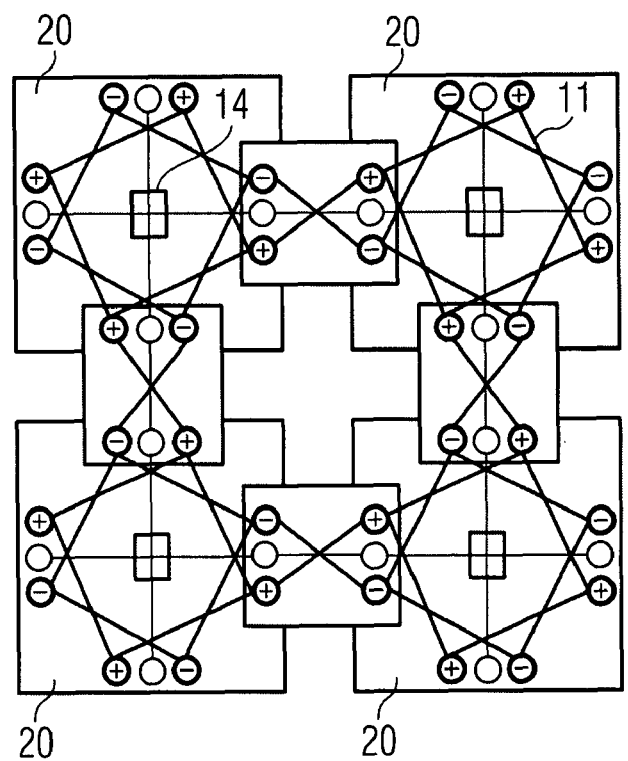
FIG. 4 shows a schematic plan view of a fourth exemplary embodiment of a lighting device described here.

FIG. 4 shows a schematic plan view of a fourth exemplary embodiment of a lighting device described here. The lighting device comprises four luminous means 20. The luminous means 20 are electrically conductively and mechanically connected to one another in pairs by connecting elements 9. Each luminous means 20 has a dedicated control apparatus 14. The individual control apparatuses 14 are connected to one another via the connecting elements 9. In this way, each luminous means 20 can be controlled as a function of the operating state of other luminous means 20 of the lighting device. More specifically, the operating state of a first luminous means 20, for example the "on" or "off"-state of this luminous means 20, is reported to the control apparatus 14 of a second luminous means 20 via a connecting element 9. Depending on the reported operating state of the first luminous means 20 the operating state of the second luminous means is selected by its control apparatus 14. For instance, the second luminous means 20 is switched on when the first luminous means 20 is switched off.

Figure 5:
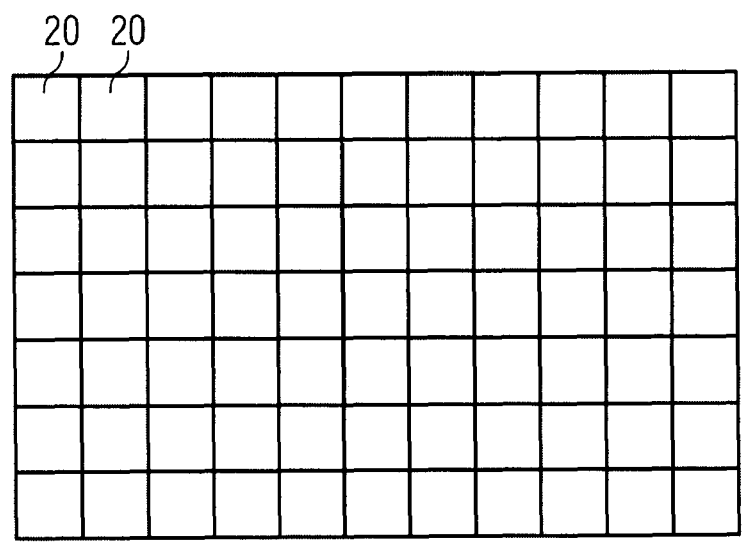
FIG. 5 shows a schematic plan view of a lighting device, in which luminous means are arranged in the form of a matrix.

FIG. 5 shows, in a schematic plan view, a lighting device, in which luminous means 20 are arranged in the form of a matrix, i.e. in rows and columns. Such a lighting device may form, for example, a coarse-grained display, each luminous means 20 representing one pixel of the display. In addition it is possible for such a lighting device to be used as wall, ceiling or floor tiles. Furthermore, it is conceivable for a lighting device in the form of a matrix, as is illustrated schematically in FIG. 5, to be used as a backlighting apparatus for a conventional display, for example an LCD display. The light 21 emitted by the luminous means in this case is preferably mixed to form white light, or the light 21 of the luminous means is generally white light.

The invention is not restricted by the description with reference to the exemplary embodiments. Rather, the invention includes any novel feature and any combination of features, which in particular includes any combination of features in the patent claims, even if this feature or this combination itself is not explicitly cited in the patent claims or exemplary embodiments.

I claim:

1. A luminous means comprising:
    a first, light-transmissive carrier;
    a second carrier; and
    an organic layer stack, which is arranged between the first carrier and the second carrier, at least four electrical connection regions being provided on a rear side, which faces away from the first carrier, of the second carrier, which connection regions are provided for electrically and mechanically connecting the luminous means to a further, identical luminous means,
    wherein at least four of the rear side electrical connection regions are arranged near an edge face on a rear side of the second carrier, and
    wherein each connection region comprises at least one connection point, which is provided for electrical contact-making.

2. The luminous means as claimed in claim 1, in which the connection region comprises at least one connection point, which is provided for passing on a control signal.

3. The luminous means as claimed in claim 1, in which at least one of the carriers contains a glass.

4. The luminous means as claimed in claim 1, having a luminous face, which has an area of at most 500 mm$^2$.

5. The luminous means as claimed in claim 1, having a luminance of at most 200 cd/m2.

6. The luminous means as claimed in claim 1, in which a control apparatus is arranged on the rear side of the second carrier and is electrically conductively connected to each connection region of the luminous means.

7. The luminous means as claimed in claim 6, in which the control apparatus on the rear side of the second carrier is electrically conductively connected to the connection points, which are provided for passing on a control signal.

8. A lighting device comprising:
    a first and a second luminous means as claimed in claim 1; and
    a connecting element, which connects the connection regions of the first and the second luminous means to one another, in which the connecting element connects the luminous means electrically and mechanically to one another.

9. The lighting device as claimed in claim 8, in which the connecting element connects the luminous means mechanically to one another by means of a plug-type connection.

10. The lighting device as claimed in claim 8 having a large number of identical luminous means, which are connected to one another in pairs by a connecting element.

11. The lighting device as claimed in claim 8, in which the luminous means are arranged in the form of a matrix.

12. The lighting device as claimed in claim 8, in which the luminous means can be driven independently of one another.

13. The lighting device as claimed in claim 10, wherein luminous means which are not arranged at an outermost edge of the lighting device are each connected to four identical luminous means via in each case one connecting element.

14. The lighting device as claimed in claim 8, wherein the connecting element has smaller external dimensions than the luminous means.

15. The lighting device as claimed in claim 14, wherein a base area of the connecting element is at most 30% of a base area of the luminous means.

16. The lighting device as claimed in claim 8, wherein each one of the connection regions of the luminous means comprise at least three different connection points which are arranged along a straight line.

17. The lighting device as claimed in claim 16, wherein the connecting elements comprise conductor tracks which connect connection points of two connection regions of two adjacent luminous means electrically to one another, and wherein the conductor tracks cross in a manner involving no electrical contact therebetween.

18. The luminous means as claimed in claim 1, which is a single organic light-emitting diode.

* * * * *